(12) United States Patent
Kang

(10) Patent No.: US 11,811,218 B2
(45) Date of Patent: Nov. 7, 2023

(54) CIRCUIT BREAKER CONTROL MODULE

(71) Applicant: LS ELECTRIC CO., LTD., Anyang-si (KR)

(72) Inventor: Sung-Hee Kang, Anyang-si (KR)

(73) Assignee: LS ELECTRIC CO., LTD., Anyang-si (KR)

( * ) Notice: Subject to any disclaimer, the term of this patent is extended or adjusted under 35 U.S.C. 154(b) by 548 days.

(21) Appl. No.: 17/041,921

(22) PCT Filed: Jan. 30, 2019

(86) PCT No.: PCT/KR2019/001283
§ 371 (c)(1),
(2) Date: Sep. 25, 2020

(87) PCT Pub. No.: WO2019/212125
PCT Pub. Date: Nov. 7, 2019

(65) Prior Publication Data
US 2021/0013709 A1    Jan. 14, 2021

(30) Foreign Application Priority Data

Apr. 30, 2018  (KR) .......................... 10-2018-0049817

(51) Int. Cl.
*H02H 7/26* (2006.01)
*G01R 15/20* (2006.01)
(Continued)

(52) U.S. Cl.
CPC ............. *H02H 7/26* (2013.01); *G01R 15/202* (2013.01); *G01R 19/10* (2013.01); *G01R 19/1659* (2013.01); *H02H 1/0007* (2013.01)

(58) Field of Classification Search
CPC .. G01R 15/202; G01R 19/10; G01R 19/1659; H01H 33/596; H01H 9/54; H01H 9/548;
(Continued)

(56) References Cited

U.S. PATENT DOCUMENTS 6,178,077 B1    1/2001  Kaluza et al.
8,929,046 B2    1/2015  Cyuzawa et al.
(Continued)

FOREIGN PATENT DOCUMENTS

CN    102386606 A    3/2012
CN    102593809 A    7/2012
(Continued)

OTHER PUBLICATIONS

Extended European Search Report dated May 10, 2021 issued in corresponding EP Application No. 19796161.8—11 Pages.
(Continued)

*Primary Examiner* — Jared Fureman
*Assistant Examiner* — Nicolas Bellido
(74) *Attorney, Agent, or Firm* — K&L Gates LLP

(57) ABSTRACT

The circuit breaker control module of the present disclosure comprises: a plurality of semiconductor switching units for blocking current flows of transmission distribution lines or performing switching operations so as to switch the current flow directions; a control unit for controlling the turn-on/turn-off operation of each semiconductor switching unit by transmitting a trip signal to each of the plurality of semiconductor switching units; and a plurality of insulation type signal transmission element units which are provided between the plurality of semiconductor switching units and the control unit such that the semiconductor switching units and the control unit are insulated, and which transmit the trip signal from the control unit to each of the plurality of semiconductor switching units, and thus the presently disclosed circuit breaker control module can reduce the risk of accidents due to an electrical arc and increase the stability and reliability of the control unit.

18 Claims, 6 Drawing Sheets

(51) Int. Cl.
*G01R 19/10* (2006.01)
*G01R 19/165* (2006.01)
*H02H 1/00* (2006.01)

(58) Field of Classification Search
CPC ........ H02H 1/00; H02H 1/0007; H02H 3/021; H02H 7/26; H03K 17/18; H03K 17/567; H03K 17/689; H03K 17/785; H03K 17/90; H03K 2217/0027
See application file for complete search history.

(56) References Cited

U.S. PATENT DOCUMENTS

| | | | |
|---|---|---|---|
| 9,065,326 B2 * | 6/2015 | Hafner | H03K 17/785 |
| 9,383,412 B2 * | 7/2016 | Shiraishi | G01R 31/327 |
| 9,599,674 B2 * | 3/2017 | Shiraishi | G01R 31/3277 |
| 9,948,084 B2 | 4/2018 | Sim | |
| 2012/0050933 A1 | 3/2012 | Ku et al. | |
| 2012/0099236 A1 * | 4/2012 | Cyuzawa | H02J 1/06 361/101 |
| 2012/0299393 A1 * | 11/2012 | Hafner | H01H 9/542 307/113 |
| 2013/0009491 A1 * | 1/2013 | Hafner | H03K 17/785 307/113 |
| 2013/0154391 A1 | 6/2013 | Urciuoli et al. | |
| 2013/0229186 A1 | 9/2013 | Shiraishi et al. | |
| 2015/0022928 A1 * | 1/2015 | Mohaddes Khorassani | H02H 3/08 361/93.7 |
| 2015/0316617 A1 | 11/2015 | Shiraishi et al. | |
| 2016/0105014 A1 * | 4/2016 | Lee | H02H 3/087 361/93.1 |
| 2016/0190791 A1 * | 6/2016 | Sim | H02H 3/087 361/93.6 |
| 2016/0204596 A1 | 7/2016 | Horinouchi et al. | |
| 2016/0282415 A1 | 9/2016 | Shiraishi et al. | |
| 2017/0040809 A1 | 2/2017 | Shiraishi et al. | |
| 2022/0293354 A1 * | 9/2022 | Askan | H01H 9/542 |

FOREIGN PATENT DOCUMENTS

| | | |
|---|---|---|
| CN | 103532356 A | 1/2014 |
| CN | 104052038 A | 9/2014 |
| CN | 104320114 A | 1/2015 |
| CN | 105529677 A | 4/2016 |
| CN | 205566745 U | 9/2016 |
| EP | 2502248 A1 | 9/2012 |
| EP | 2532081 A2 | 12/2012 |
| JP | 2011010393 A | 1/2011 |
| JP | 2013181822 A | 9/2013 |
| JP | 2016103427 A | 6/2016 |
| JP | 2016127026 A | 7/2016 |
| JP | 2016167406 A | 9/2016 |
| KR | 20100040819 A | 4/2010 |
| KR | 20120014930 A | 2/2012 |
| KR | 20120089751 A | 8/2012 |
| KR | 20130022346 A | 3/2013 |
| KR | 20150040490 A | 4/2015 |
| KR | 20160042681 A | 4/2016 |

OTHER PUBLICATIONS

International Search Report for related International Application No. PCT/KR2019/001283; report dated Nov. 7, 2019; (7 pages).
Written Opinion for related International Application No. PCT/KR2019/001283; report dated Nov. 7, 2019; (5 pages).
Japanese Notice of Allowance for related Japanese Application No. 2020-554301; action dated Jun. 14, 2022; (3 pages).
Chinese Notice of Allowance for related Chinese Application No. 201980016749.6; action dated Aug. 3, 2022; (7 pages).
Chinese Office Action for related Chinese Application No. 201980016749.6; action dated Jan. 30, 2022; (5 pages).
Japanese Office Action for related Japanese Application No. 2020-554301; action dated Dec. 10, 2021; (4 pages).

* cited by examiner

CIRCUIT BREAKER CONTROL MODULE

CROSS-REFERENCE TO RELATED APPLICATIONS

The present application is a National Stage of International Application No. PCT/KR2019/001283, filed on Jan. 30, 2019, which claims the benefit of earlier filing date and right of priority to Korean Application No. 10-2018-0049817 filed on Apr. 30, 2018, the contents of which are all hereby incorporated by reference herein in their entirety.

FIELD

The present disclosure relates to a circuit breaker control module that cuts off failure current of a power system or the power transmission and distribution line. More specifically, the present disclosure relates to a circuit breaker control module that includes an electronic semiconductor switching structure to reduce risk of accident due to an arc, and maintains a control circuit for controlling the circuit breaker in an insulated state, thereby to increases stability and reliability thereof.

BACKGROUND

When a failure occurs in a power system, a power transmission and distribution line, the failure current is cut off using a DC circuit breaker to protect a power device and equipment electrically connected to a failure line. For example, when overvoltage/overcurrent such as surge voltage occurs in the power transmission and distribution line, a controller or a relay that has detected the overvoltage/overcurrent supplies a trip signal to the circuit breaker on the failure line, thereby cutting off the failure line through which the failure current flows.

However, when a cut-off switch on the failure line is directly activated in the above-described conventional manner, an electric arc is generated between both ends of the failure line. When this arc occurs, the electrical cut-off effect is reduced. As the number of cut-off times increases, the cut-off switches may be damaged.

Therefore, in recent years, when developing the circuit breaker to break the power transmission line and power distribution line, the circuit breaker is designed using a semiconductor switch for power that has excellent response speed and minimizes damage to a surrounding line even when a defect occurs.

As described above, when current of the failure line is cut off, the cut-off switches are directly controlled so that the failure line breaks. In this case, electric arcs are generated. Therefore, first cutting off the failure line using a power semiconductor switch and then activating the cut-off switches may reduce the risk of arcing.

However, the semiconductor switches for power may receive the trip signal directly from a separate controller or meter in a state while the semiconductor switches are disposed on the power transmission and distribution line. Thus, when the surge voltage, overvoltage, overcurrent, etc. occurs on the power transmission and distribution line, the controller or the meter was electrically affected. Thus, when the controller or the meter is directly affected by the overvoltage/overcurrent, stability and reliability thereof have to be remarkably deteriorated.

Further, in a prior art, sensing methods for sensing current of the power transmission and distribution line have detected a current amount via a current sensing element such as a resistor directly disposed on a bus bar of the power transmission and distribution line. In a process of detecting the current amount, when the surge voltage, etc., occurs in the power transmission and distribution line, the controller or the meter is electrically affected. Thus, the circuit breaker and the circuit breaker controller are exposed to electrical hazards.

SUMMARY

The present disclosure is intended to solve the above problems. Accordingly, the present disclosure aims to provide a circuit breaker control module in which when a failure current of a power system or a power transmission and distribution line is cut off, an electronic semiconductor switching structure is used to first break the failure line, thereby reduce risk of accident due to arcing.

Further, a purpose of the present disclosure is to provide a circuit breaker control module capable of insulating a control circuit controlling a circuit breaker from a failure line through which failure current flows, thereby increasing stability and reliability of the control circuit.

One aspect of the present disclosure provides a circuit breaker control module comprising: a plurality of semiconductor switching units for cutting off current flow in a power transmission and distribution line or for switching a current flow direction in the power transmission and distribution line; a controller configured to transmit a trip signal to each of the plurality of semiconductor switching units to control turn-on or turn-off operation of each of the semiconductor switching units; and a plurality of insulated signal transmission elements respectively disposed between the plurality of semiconductor switching units and the controller to insulate the plurality of semiconductor switching units from the controller, wherein the plurality of insulated signal transmission elements are configured to receive the trip signal from the controller and transmit the trip signal to the plurality of semiconductor switching units, respectively.

In one embodiment, the plurality of semiconductor switching units includes first and second semiconductor switching units, wherein the first semiconductor switching unit includes: a first switching element disposed at and directly connected in a series manner to the power transmission and distribution line and configured to be turned on or off based on the trip signal from the controller; and a first diode element disposed at the power transmission and distribution line and connected in a parallel manner to the first switching element and configured to allow current to flow in the power transmission and distribution line when the first switching element is turned off, wherein the second semiconductor switching unit includes: a second switching element disposed at the power transmission and distribution line and connected in a series manner to the first switching element, and configured to be turned on or off based on the trip signal from the controller; and a second diode element disposed at the power transmission and distribution line and connected in a parallel manner to the second switching element and having a current flow direction opposite to a current flow direction of the first diode element, wherein the second diode element is configured to allow current to flow in the power transmission and distribution line when the second switching element is turned off.

In one embodiment, the controller is configured to: transmit the trip signal to the first and second switching elements to turn off the first and second switching elements to cut off current flow in the power transmission and distribution line; turn on the first switching element and transmit the trip signal only to the second switching element to turn off the second switching element to allow current in a reverse direction in the power transmission and distribution line; or turn on the second switching element and transmit the trip signal only to the first switching element to turn off the first switching element to allow current in a forward direction in the power transmission and distribution line.

In one embodiment, each of the plurality of insulated signal transmission elements includes a plurality of photocouplers or at least one isolator, wherein the plurality of photocouplers or the at least one isolator receive the trip signal from the controller and transmit the trip signal to each of the plurality of semiconductor switching units.

In one embodiment, each of the plurality of insulated signal transmission elements includes a plurality of photocouplers or at least one isolator, wherein the plurality of photocouplers or the at least one isolator transmit a detection signal corresponding to a current amount flowing in the power transmission and distribution line to each of the plurality of semiconductor switching units.

In one embodiment, the plurality of semiconductor switching units includes first and second semiconductor switching units disposed at and directly connected in a series manner to the power transmission and distribution line, wherein the circuit breaker control module further comprises: at least one cut-off switch disposed at the power transmission and distribution line and connected in a series manner to the plurality of semiconductor switching units to cut off the power transmission and distribution line under control of the controller; at least one inductance disposed at the power transmission and distribution line and connected in a series manner to the plurality of semiconductor switching units; at least one overcurrent prevention fuse disposed at the power transmission and distribution line and connected in a series manner to the plurality of semiconductor switching units; a first current amount detector disposed on an input terminal or an output terminal of the second semiconductor switching unit to detect a current amount flowing in the input terminal or the output terminal of the second semiconductor switching unit in real time and to transmit a first detection signal corresponding to the detected current amount to the controller.

In one embodiment, the first current amount detector includes a Hall sensor spaced by a predetermined distance from the power transmission and distribution line, wherein the Hall sensor detects an electromagnetic field generated from the power transmission and distribution line, wherein the first current amount detector transmits current and voltage values corresponding to the detected electromagnetic field to the controller.

In one embodiment, the circuit breaker control module further comprises a second current amount detector disposed on an input terminal or an output terminal of the first semiconductor switching unit to detect a current amount flowing in the input terminal or the output terminal of the first semiconductor switching unit in real time and to transmit a second detection signal corresponding to the detected current amount to the controller.

In one embodiment, the controller is configured to: compare the first detection signal from the first current amount detector with the second detection signal from the second current amount detector; and when a voltage difference corresponding to a difference between the first and second detection signals is larger or smaller than a preset reference voltage value range, simultaneously transmit the trip signal to the first and second semiconductor switching units to cut off current flow in the power distribution line.

In one embodiment, the circuit breaker control module further comprises: a first short-circuit generator disposed between and connected to the input terminal or the output terminal of the second semiconductor switching unit and a first ground voltage source and connected in a parallel manner to the second semiconductor switching unit, wherein when a surge voltage occurs at the input terminal or the output terminal of the second semiconductor switching unit, the first short-circuit generator is configured to short the surge voltage to the first ground voltage source; a second short-circuit generator connected in a parallel manner to the first and second semiconductor switching units, wherein when a surge voltage occurs across the plurality of semiconductor switching units, the second short-circuit generator is configured to short the surge voltage to a ground voltage; and a third short-circuit generator disposed between and connected to an input terminal or an output terminal of the first semiconductor switching unit and a second ground voltage source and connected in a parallel manner to the first semiconductor switching unit, wherein when a surge voltage occurs at the input terminal or the output terminal of the first semiconductor switching unit, the third short-circuit generator is configured to short the surge voltage to the second ground voltage source.

In one embodiment, the circuit breaker control module further comprises: a first voltage detector connected in a parallel manner to the first short-circuit generator to detect an input terminal or output terminal voltage of the second semiconductor switching unit and supply the detected input terminal or output terminal voltage thereof to the controller; and a second voltage detector connected in a parallel manner to the third short-circuit generator to detect an input terminal or output terminal voltage of the first semiconductor switching unit and supply the detected input terminal or output terminal voltage thereof to the controller.

In one embodiment, the controller is configured to: compare the input terminal or output terminal voltage of the second semiconductor switching unit detected from the first voltage detector with the input terminal or output terminal voltage of the first semiconductor switching unit detected from the second voltage detector; and when a voltage difference voltage therebetween is larger or smaller than a preset reference voltage value range, simultaneously transmit the trip signal to the first and second semiconductor switching units to cut off current flow in the power transmission and distribution line.

In one embodiment, the circuit breaker control module further comprises: a first insulated signal transmitter disposed between and connected to the first voltage detector and the controller to insulate the first voltage detector and the controller from each other, wherein the first insulated signal transmitter is configured to transmit the input terminal or output terminal voltage of the second semiconductor switching unit detected from the first voltage detector to the controller; and a second insulated signal transmitter disposed between and connected to the second voltage detector and the controller to insulate the second voltage detector and the controller from each other, wherein the second insulated signal transmitter is configured to transmit the input terminal or output terminal voltage of the first semiconductor switching unit detected from the second voltage detector to the controller.

When the failure current of the power system or the power transmission and distribution line is cut off, the circuit breaker control module according to the present disclosure having various technical features as described above may use the electronic semiconductor switching structure to first break the failure line, thereby reduce risk of accident due to arcing.

Further, the circuit breaker control module according to the present disclosure having various technical features as described above may be capable of insulating the control circuit controlling the circuit breaker from the failure line through which the failure current flows, thereby increasing stability and reliability of the control circuit.

DETAILED DESCRIPTION

Figure 1:
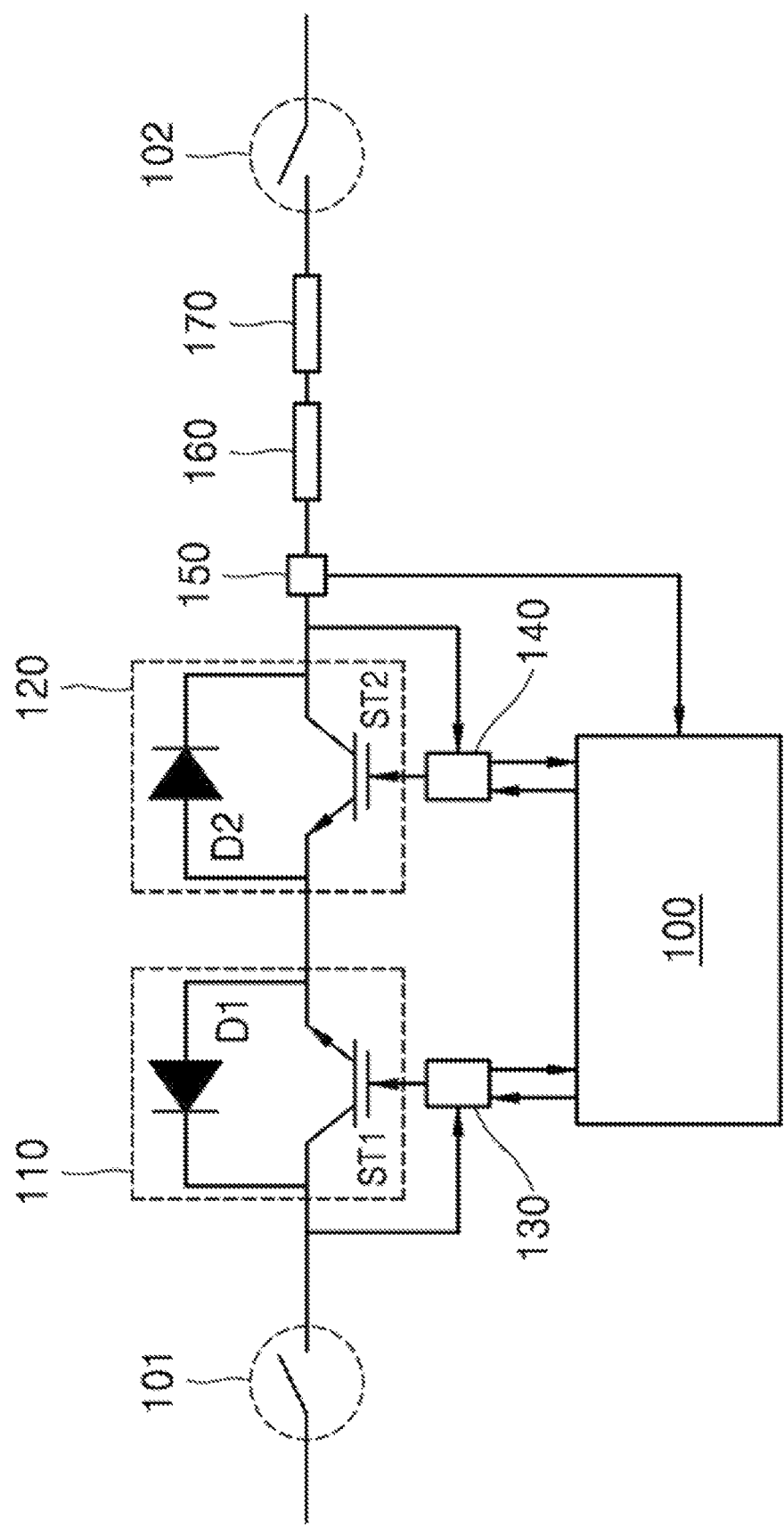
FIG. 1 is a block diagram showing a configuration of a circuit breaker control module according to a first embodiment of the present disclosure.

Hereinafter, exemplary embodiments of the present disclosure will be described in detail with reference to the accompanying drawings so that those skilled in the art to which the present disclosure belongs may easily implement the embodiments. However, the present disclosure may be implemented in many different forms and may not be limited to the embodiments illustrated herein. Further, in order to clearly illustrate the present disclosure, components not related to the present disclosure are omitted in the drawings. Similar reference numerals are used for similar elements throughout the specification.

Hereinafter, a circuit breaker control module according to the present disclosure will be described in more detail.

FIG. 1 is a block diagram showing a configuration of a circuit breaker control module according to a first embodiment of the present disclosure.

The circuit breaker control module shown in FIG. 1 may include a plurality of semiconductor switching units 110 and 120, a controller 100, a plurality of insulated signal transmission elements 130 and 140, at least one cut-off switch 101 and 102, at least one inductance 160, at least one overcurrent prevention fuse 170, and a first current amount detector 150.

Specifically, each of the plurality of semiconductor switching units 110 and 120 is disposed at a power system, or a power transmission and distribution line. The semiconductor switching units 110 and 120 may cut off current flow in the power transmission and distribution line using a semiconductor switching element for power, or may switch a current flow direction in the power transmission and distribution line.

To this end, among the plurality of semiconductor switching units 110 and 120, a first semiconductor switching unit 110 may include a first switching element ST1 connected in a series manner to the power transmission and distribution line and turned on or off based on a trip signal from the controller 100, and a first diode element D1 connected in a parallel manner to the first switching element ST1 to allow current to flow in the power transmission and distribution line when the first switching element ST1 is turned off.

Among the plurality of semiconductor switching units 110 and 120, a second semiconductor switching unit 120 may include a second switching element ST2 disposed at the power transmission and distribution line and connected in a series manner to the first switching element ST1 and turned on or off based on the trip signal from the controller 100, and a second diode element D2 connected in a parallel manner to the second switching element ST2 and having an opposite current flow direction to that of the first diode element D1 to allow current to flow in the power transmission and distribution line when the second switching element ST2 is turned off.

Each of the plurality of semiconductor switching units 110 and 120 may be embodied as an element having both of properties of a MOSFET (Metal Oxide Semiconductor Field Effect Transistor) when current flow has a forward direction during turn-on thereof, and properties of a diode when current flow has a reverse direction during turn-on thereof. In this case, each of the plurality of semiconductor switching units 110 and 120 may be embodied as a single element.

The controller 100 may control a switching operation of each of the semiconductor switching units 110 and 120 based on a current flow state of the power transmission and distribution line, using at least one MCU (Micro Controller Unit) or CPU (Central Processing Unit).

The controller 100 may compare a current amount of the power transmission and distribution line as detected by and input from the first current amount detector 150 with a preset reference current amount, and may determine whether the power transmission and distribution line has failed based on the comparison result. In this connection, the failure determination of the power transmission and distribution line may be defined as follows: a failure may be determined when a surge voltage is applied to the power transmission and distribution line or an overvoltage or overcurrent occurs therein.

Accordingly, when determining that the failure has occurred in the power transmission and distribution line, the controller 100 may transmit the trip signal to each of the semiconductor switching units 110 and 120 via the insulated signal transmission elements 130 and 140 to controls turn-on or turn-off operation of each of the semiconductor switching units 110 and 120.

When the trip signal is transmitted from the controller 100 to the plurality of semiconductor switching units 110 and 120, all of the plurality of semiconductor switching units 110 and 120 are turned off, thereby cutting off current flow in the power transmission and distribution line.

When determining that the failure has occurred in the power transmission and distribution line, the controller 100 may first turn off the at least one cut-off switch 101 and 102 placed at the power transmission and distribution line to directly cut off the current flow in the power transmission and distribution line. However, each of the cut-off switches 101 and 102 is a mechanical switch. Thus, when the cut-off switch 101 and 102 are directly turned off, an arc due to high voltage may occur. The more frequent cut-offs may cause the risk of burnout to increase.

Accordingly, when determining that the failure has occurred in the power transmission and distribution line, the controller 100 may transmit the trip signal to each of the semiconductor switching units 110 and 120 through each of the insulated signal transmission elements 130 and 140, thereby first turning off each of the semiconductor switching units 110 and 120. Thereafter, the controller may break the power transmission and distribution line using each of the cut-off switches 101 and 102 disposed at the power transmission and distribution line, such that the risk of arcing is reduced and thus the stability of the circuit breaker is increased.

Each of the plurality of insulated signal transmission elements 130 and 140 is disposed between each of the plurality of semiconductor switching units 110 and 120 and the controller 100 to isolate each of the plurality of semiconductor switching units 110 and 120 from the controller 100.

Each of the insulated signal transmission elements 130 and 140 may receive a turn-on switching signal and the trip signal from the controller 100 and transmit the turn-on switching signal and the trip signal to each of the semiconductor switching units 110 and 120.

Each of the insulated signal transmission elements 130 and 140 may include at least one element of at least one bidirectional digital isolator, and a plurality of photocouplers an insulated signal transmission element. Each of the insulated signal transmission elements 130 and 140 may allow each of the semiconductor switching units 110 and 120 directly connected to the power transmission and distribution line to be isolated from the controller 100.

Each of the semiconductor switching units 110 and 120 and the controller 100 may be maintained in an insulated state from each other. In this case, even when surge voltage, overvoltage, or overcurrent occurs in the power transmission and distribution line, the electrical effect on the controller 100 may be minimized.

In one example, each of the insulated signal transmission elements 130 and 140 may transmit, to the controller 100, current amount flowing in the power transmission and distribution line, for example, a detection signal corresponding to a current amount flowing in an input terminal or an output terminal of each of the semiconductor switching units 110 and 120. That is, each of the insulated signal transmission elements 130 and 140 may transmit the turn-on switching signal, and the trip signal from the controller 100 to each of the semiconductor switching units 110 and 120, and further may detect the current amount flowing in the input terminal or the output terminal of each of the semiconductor switching units 110 and 120, and may transmit the detection signal corresponding to the detected current amount to the controller 100. A configuration and an operation of each of the insulated signal transmission elements 130 and 140 will be described in more detail with reference to the accompanying drawings.

The at least one cut-off switch 101 and 102 may be connected in a series manner to the plurality of semiconductor switching units 110 and 120 and may be disposed the power transmission and distribution line. The at least one cut-off switch 101 and 102 may be connected in a series manner to the input terminal or the output terminal of each of the semiconductor switching units 110 and 120. When a cut-off signal, for example, a turn-off signal from the controller 100 is input thereto, the at least one cut-off switch 101 and 102 may break the power transmission and distribution line.

The at least one inductance 160 may be connected in a series manner to the plurality of semiconductor switching units 110 and 120 and may be disposed at the power transmission and distribution line, and may be used to detect a current change and a back electromotive force ratio of the power transmission and distribution line and to transmit the detected value to the controller 100.

The at least one overcurrent prevention fuse 170 may be connected in a series manner to the plurality of semiconductor switching units 110 and 120 and may be disposed at the power transmission and distribution line. When overcurrent occurs, the at least one overcurrent prevention fuse 170 may allow the power transmission and distribution line to be automatically shorted circuited.

The first current amount detector 150 may be disposed at the input terminal or the output terminal of the second semiconductor switching unit 120 among the plurality of semiconductor switching units 110 and 120 connected in the series manner to the power transmission and distribution line. The first current amount detector 150 may detect the current amount flowing in the input terminal or the output terminal of the second semiconductor switching unit 120 in real time, and may transmit the detection signal corresponding to the detected current amount to the controller 100. Accordingly, the controller 100 may compare the current amount of the power transmission and distribution line as detected by and input from the first current amount detector 150 with a preset reference current amount, and then may determine whether the power transmission and distribution line has failed, based on the comparison result.

Figure 2:
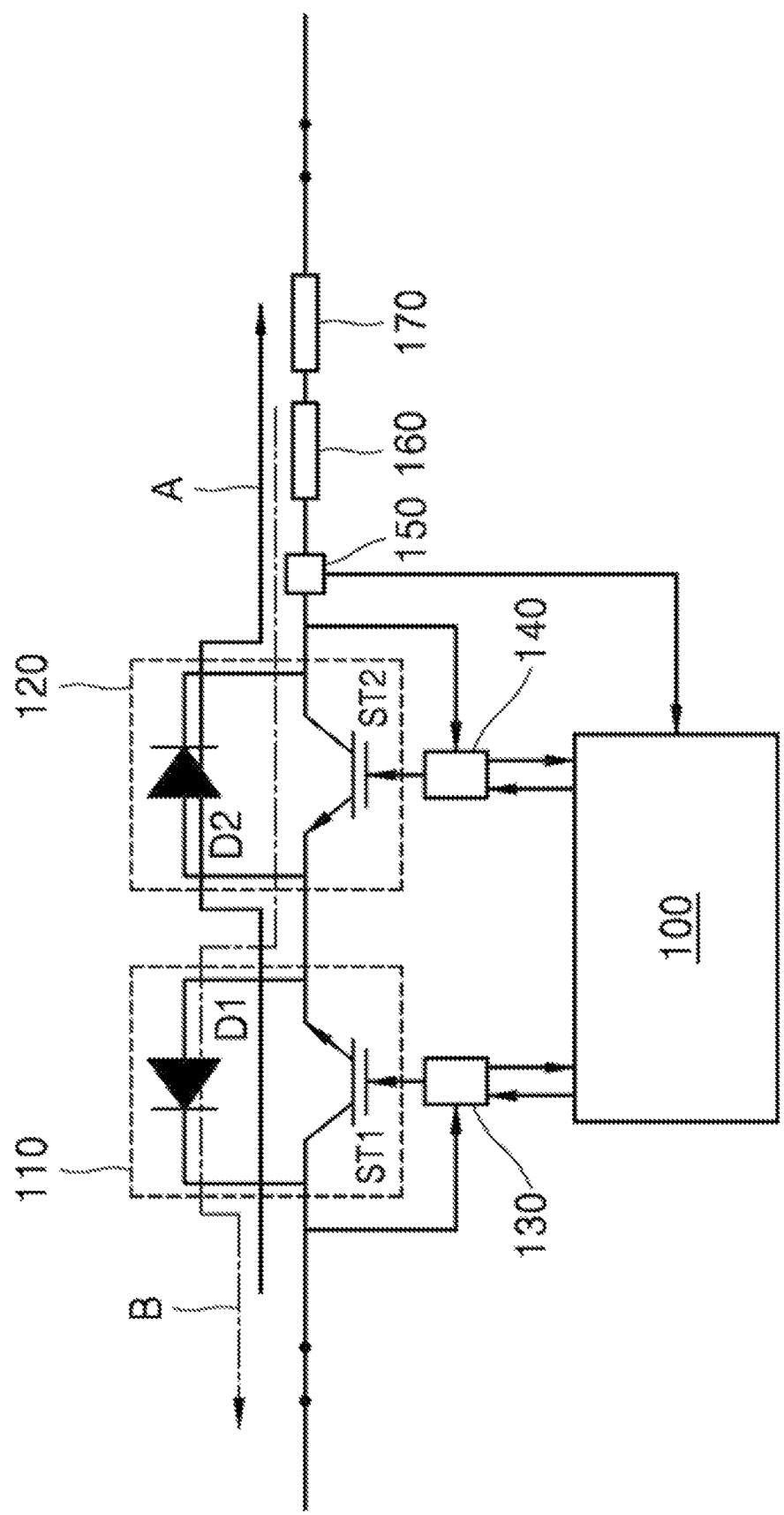
FIG. 2 is a block diagram for describing a current flow direction control method using the circuit breaker control module as shown in FIG. 1.

FIG. 2 is a configuration diagram for describing a current flow direction control method using the circuit breaker control module shown in FIG. 1.

As shown in FIG. 2, the first switching element ST1 of the first semiconductor switching unit 110 is connected in a serial manner to the power transmission and distribution line, and is turned on or off based on the turn-on switching signal and the trip signal from the controller 100.

In this connection, the first diode element D1 is connected in a parallel manner to the first switching element ST1. Thus, when the first switching element ST1 is turned off, current flows in a reverse direction (B arrow direction) according to a current flow direction of the first diode element D1 in the power transmission and distribution line.

The second switching element ST2 of the second semiconductor switching unit 120 is disposed at the power transmission and distribution line and is connected in the series manner to the first switching element ST1, and is turned on or off based on the turn-on switching signal and the trip signal from the controller 100.

The second diode element D2 is connected in a parallel manner to the second switching element ST2 and has the opposite current flow direction to that of the first diode element D1. Accordingly, when the second switching element ST2 is turned off, current flows in a forward direction (A arrow direction) according to the current flow direction of the second diode element D2 in the power transmission and distribution line.

When using this configuration, the controller 100 may transmit the trip signal to both the first and second switching elements ST1 and ST2, thereby turning off the first and second switching elements ST1 and ST2 to cut off the current flow in the power transmission and distribution line.

The controller 100 may turns on the first switching element ST1 via the turn-on switching signal, but may send the trip signal only to the second switching element ST2 to turn off the second switching element ST2. Thus, the current may be controlled to flow in the power transmission and distribution line in the reverse direction (B arrow direction).

Alternatively, the controller 100 may turn on the second switching element ST2 via the turn-on switching signal but may transmit the trip signal only to the first switching element ST1, thereby turning off the first switching element ST1. Thus, the current may be controlled to flow of the power transmission and distribution line in the forward direction (A arrow direction).

Figure 3A:
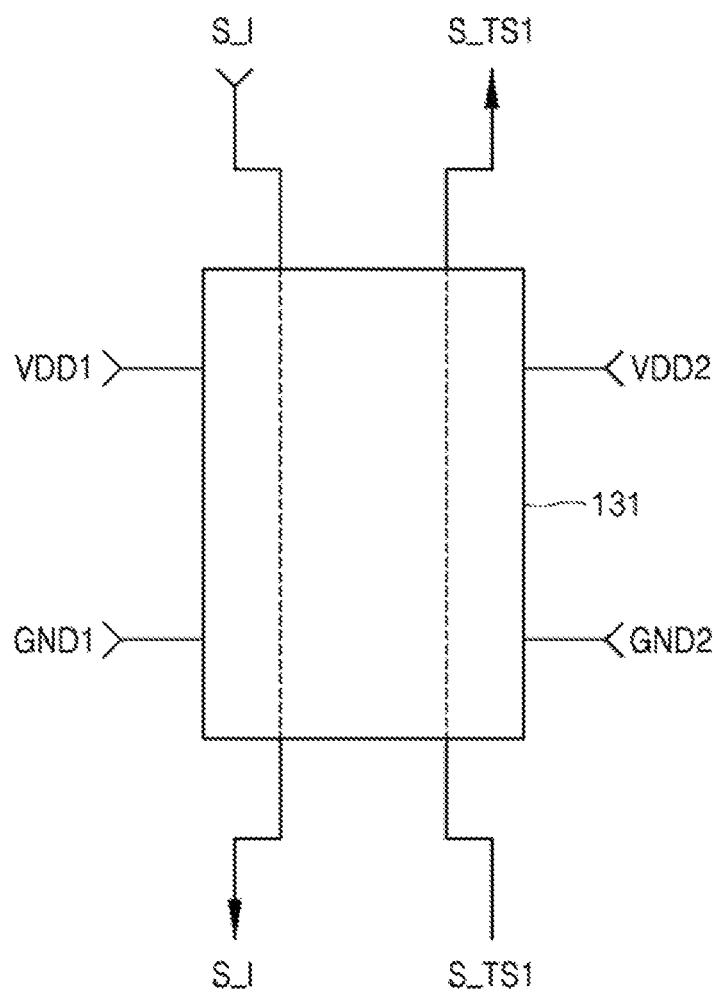
FIGS. 3A and 3B are block diagrams specifically showing configurations of a first insulated signal transmission element as shown in FIG. 1 and FIG. 2.
Figure 3B:
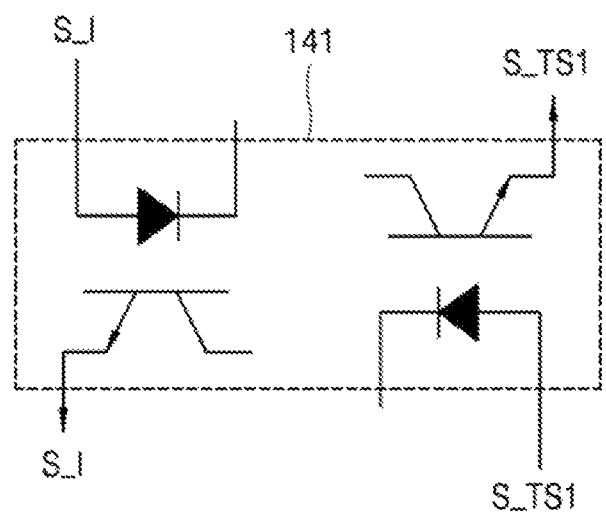

FIGS. 3A and 3B are configuration diagrams specifically showing configurations of the first insulated signal transmission element shown in FIG. 1 and FIG. 2.

Specifically, FIG. 3A is a diagram showing an example in which the first insulated signal transmission element 130 includes a bidirectional digital isolator 131 as an insulated signal transmission element.

The bidirectional digital isolator 131 may allow the first semiconductor switching unit 110 directly connected to the power transmission and distribution line to be isolated from the controller 100. While the bidirectional digital isolator 131 is in an isolated state, the bidirectional digital isolator 131 may receive the turn-on switching signal or the trip signal S_TS1 from the controller 100 and may supply the turn-on switching signal or the trip signal S_TS1 to the first semiconductor switching unit 110.

Further, the bidirectional digital isolator 131 in FIG. 3A may detect the current amount flowing in the power transmission and distribution line, for example, the current amount flowing in the input terminal or the output terminal of the first semiconductor switching unit 110 and may transmit a control signal S_1 corresponding to the detected amount to the controller 100.

Although not shown in the drawing, the second insulated signal transmission element 140 may include the bidirectional digital isolator 131 as the insulated signal transmission element. In this case, the bidirectional digital isolator 131 of the second insulated signal transmission element 140 may allow the second semiconductor switching unit 120 directly connected to the power transmission and distribution line to be isolated from the controller 100. While the bidirectional digital isolator 131 is in an isolated state, the bidirectional digital isolator 131 may receive the turn-on switching signal or the trip signal from the controller 100 and may supply the turn-on switching signal or the trip signal to the second semiconductor switching unit 120. Further, the bidirectional digital isolator 131 may detect the current amount flowing in the power transmission and distribution line, for example, the current amount flowing in the input terminal or the output terminal of the second semiconductor switching unit 120 and may transmit a control signal S_1 corresponding to the detected amount to the controller 100.

Next, FIG. 3B is a diagram showing an example in which two photocouplers 141 having opposite current flow directions are embodied as the first insulated signal transmission element 130.

The two photocouplers 141 having opposite current flow directions may allow the first semiconductor switching unit 110 directly connected to the power transmission and distribution line to be insulated from the controller 100. While the two photocouplers 141 having opposite current flow directions are in an isolated state, the two photocouplers 141 may receive the turn-on switching signal or the trip signal S_TS1 from the controller 100 and may supply the turn-on switching signal or the trip signal S_TS1 to the first semiconductor switching unit 110.

Further, the two photocouplers 141 having opposite current flow directions may detect the current amount flowing in the power transmission and distribution line, for example, the current amount flowing in the input terminal or the output terminal of the first semiconductor switching unit 110 and may transmit a control signal S_1 corresponding to the detected amount to the controller 100.

Although not shown in the drawing, the second insulated signal transmission element 140 may include two photocouplers 141 having opposite current flow directions as the insulated signal transmission element. In this case, the two photocouplers 141 having opposite current flow directions may allow the second semiconductor switching unit 120 directly connected to the power transmission and distribution line to be insulated from the controller 100. While the two photocouplers 141 having opposite current flow directions are in an isolated state, the two photocouplers 141 may receive the turn-on switching signal or the trip signal S_TS1 from the controller 100 and may supply the turn-on switching signal or the trip signal S_TS1 to the second semiconductor switching unit 120. Further, the two photocouplers 141 having opposite current flow directions may detect the current amount flowing in the power transmission and distribution line, for example, the current amount flowing in the input terminal or the output terminal of the second semiconductor switching unit 120 and may transmit a control signal S_1 corresponding to the detected amount to the controller 100.

When using the first and second insulated signal transmission elements 130 and 140 as configured above, the controller 100 may receive each of the detection signals corresponding to each of the current amounts across each of the first and second semiconductor switching units 110 and 120 through each of the first and second insulated signal transmission elements 130 and 140. In this connection, the detection signals based on the current amounts across the first and second semiconductor switching units 110 and 120 respectively may be converted to voltage values based on characteristics of the first and second insulated signal transmission elements 130 and 140 and then the converted voltages may be input to the controller.

Accordingly, the controller 100 may compare the detection signals based on the current amounts across the first and second semiconductor switching units 110 and 120 respectively with each other. When a voltage difference therebetween is larger or smaller than a preset reference voltage value range, the controller 100 may simultaneously transmit the trip signal to the plurality of semiconductor switching units 110 and 120 to cut off the current flow in the power transmission and distribution line.

Figure 4:
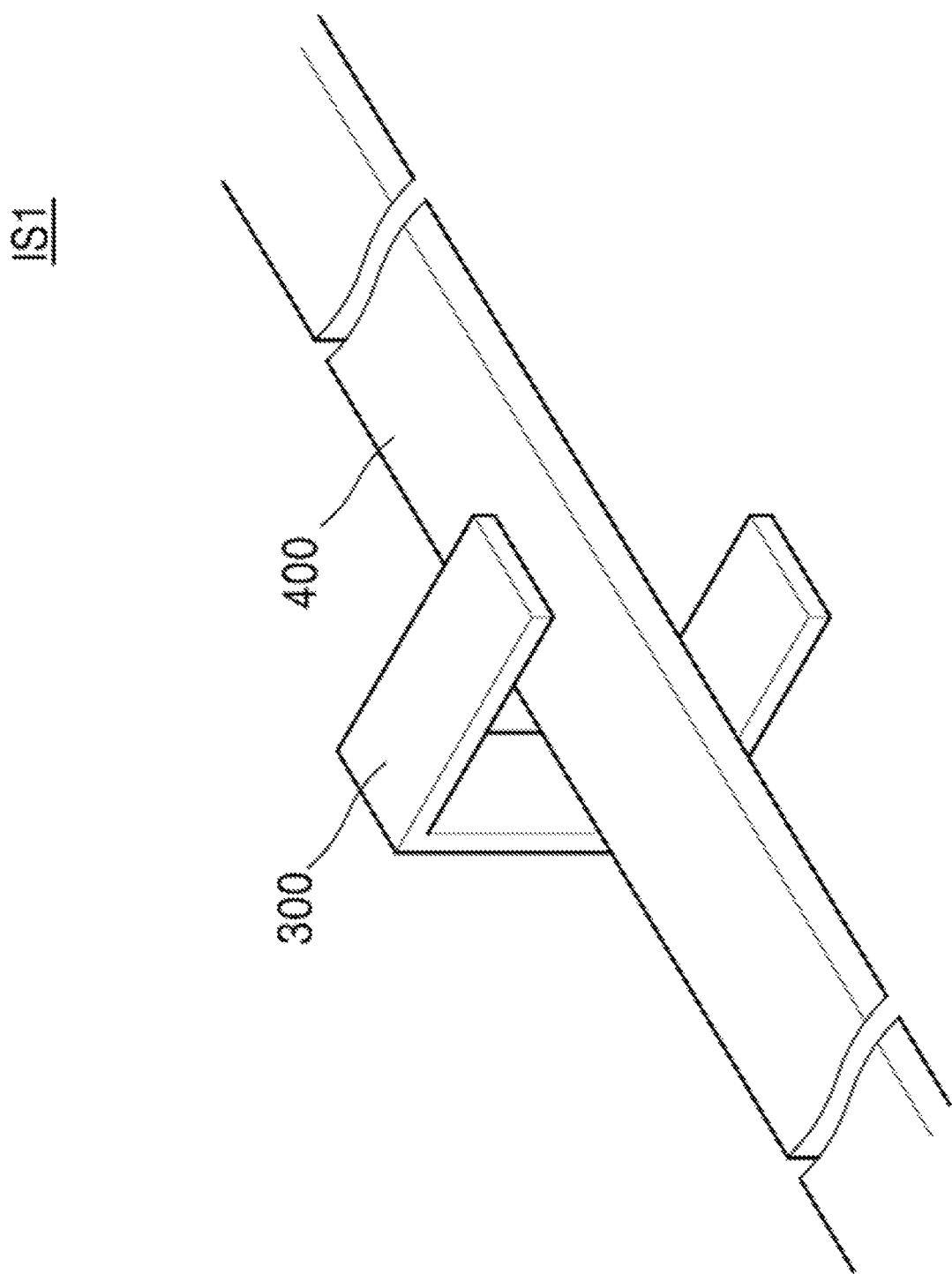
FIG. 4 is a schematic diagram showing a configuration of a first current amount detector as shown in FIG. 1 and FIG. 2.

FIG. 4 is a schematic diagram showing a configuration of the first current amount detector shown in FIG. 1 and FIG. 2.

The first current amount detector 150 shown in FIG. 4 may be disposed at the input terminal or the output terminal of the second semiconductor switching unit 120 among the plurality of semiconductor switching units 110 and 120 connected in the series manner to the power transmission and distribution line. The first current amount detector 150 may detect the current amount flowing in the input terminal or the output terminal of the second semiconductor switching unit 120 in real time and may transmit the detection signal corresponding to the detected current amount to the controller 100.

To this end, as shown in FIG. 4, the first current amount detector 150 may detect an electromagnetic field of the power transmission and distribution line using a Hall sensor 300 spaced by a predetermined distance from a bus bar 400 of the power transmission and distribution line, and may transmit current and voltage values corresponding to the detected electromagnetic field to the controller 100. When the current amount is detected using the Hall sensor 300 spaced by a predetermined distance from the bus bar 400 of the power transmission and distribution line, an insulation state between the power transmission and distribution line and the controller 100 may be maintained without using a separate insulation element. Thus, the stability of the controller 100 may be improved. The controller 100 may compare the current amount of the power transmission and distribution line detected by the first current amount detector 150 with a preset reference current amount. Then, the controller 100 may stably determine whether the power transmission and distribution line has failed, based on the comparison result.

Figure 5:
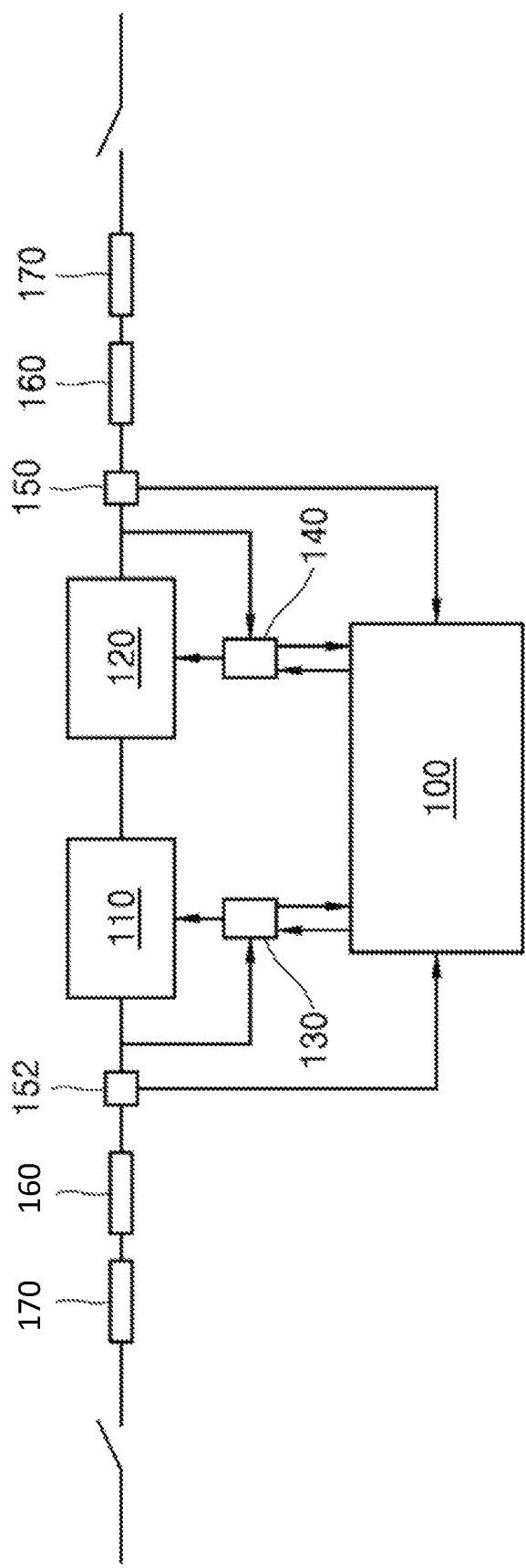
FIG. 5 is a block diagram showing a configuration of a circuit breaker control module according to a second embodiment of the present disclosure.

FIG. 5 is a block diagram showing a configuration of a circuit breaker control module according to a second embodiment of the present disclosure.

The circuit breaker control module shown in FIG. 5 may further include a second current amount detector 152 placed on the input terminal or the output terminal of the first semiconductor switching unit 110 among the plurality of semiconductor switching units 110 and 120 connected in a series manner to the power transmission and distribution line.

The second current amount detector 152 may detect in real time the amount of current flowing in the input terminal or the output terminal of the first semiconductor switching unit 110, and may transmit a detection signal corresponding to the detected current amount to the controller 100.

The second current amount detector 152 may detect an electromagnetic field generated from the input terminal or the output terminal of the first semiconductor switching unit 110 using a Hall sensor 300 spaced by a predetermined distance from a bus bar 400 of the power transmission and distribution line, and may transmit current and voltage values corresponding to the detected electromagnetic field to the controller 100.

Thus, the controller 100 may compare the first current amount detection signal from the first current amount detector 150 and the second current amount detection signal from the second current amount detector 152 with each other. When a voltage difference corresponding to a difference between the first and second current amount detection signals is larger or smaller than a preset reference voltage value range, the controller 100 may simultaneously transmit the trip signal to the plurality of semiconductor switching units 110 and 120 to cut off current flow in the power transmission and distribution line.

Figure 6:
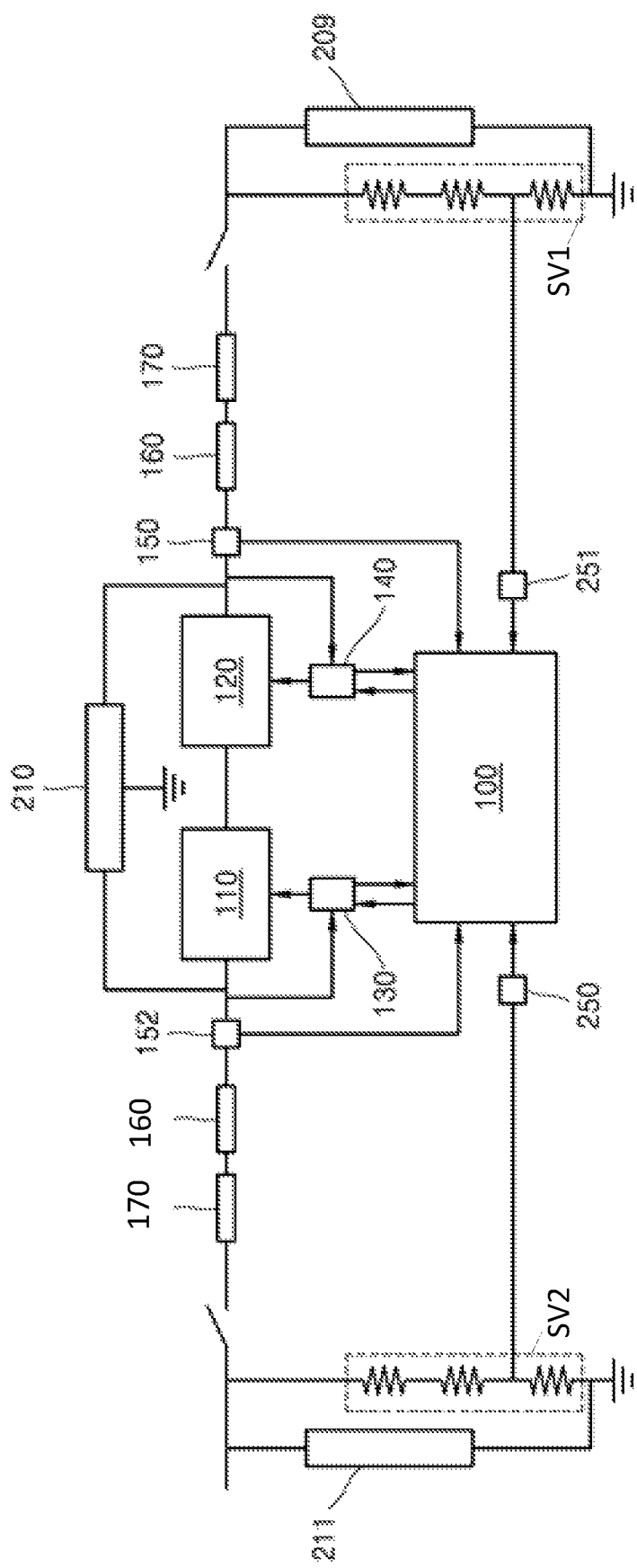
FIG. 6 is a block diagram showing a configuration of a circuit breaker control module according to a third embodiment of the present disclosure.

FIG. 6 is a block diagram showing a configuration of a circuit breaker control module according to a third embodiment of the present disclosure.

As shown in FIG. 6, the circuit breaker control module may further include a first short-circuit generator 209, a second short-circuit generator 210, a third short-circuit generator 211, a first voltage detector SV1, and a second voltage detector SV2.

In this connection, the first short-circuit generator 209 is connected to and disposed between a second ground voltage source and the input terminal or the output terminal of the second semiconductor switching unit 120 among the plurality of semiconductor switching units 110 and 120 connected in a series manner to the power transmission and distribution line. The first short-circuit generator 209 is connected in a parallel manner to the second semiconductor switching unit 120. The first short-circuit generator 209 includes a metal oxide varistor. Accordingly, when the surge voltage occurs in the input terminal or the output terminal of the second semiconductor switching unit 120, the first short-circuit generator 209 may short the surge voltage to the ground voltage to stabilize the input terminal or output terminal voltage of the second semiconductor switching unit 120.

The second short-circuit generator 210 is connected in a parallel manner to the first and second semiconductor switching units 110 and 120 connected in a series manner to the power transmission and distribution line. When the surge voltage occurs across the first and second semiconductor switching units 110 and 120, the second short-circuit generator 210 may short the surge voltage to the ground voltage to stabilize the voltage across the first and second semiconductor switching units 110 and 120.

In this connection, the third short-circuit generator 211 is connected to and disposed between a first ground voltage source and the input terminal or the output terminal of the first semiconductor switching unit 110 among the plurality of semiconductor switching units 110 and 120 connected in a series manner to the power transmission and distribution line. The third short-circuit generator 211 is connected in a parallel manner to the first semiconductor switching unit 110. The third short-circuit generator 211 includes a metal oxide varistor. Accordingly, when the surge voltage occurs in the input terminal or the output terminal of the first semiconductor switching unit 110, the third short-circuit generator 211 may short the surge voltage to the ground voltage to stabilize the input terminal or output terminal voltage of the first semiconductor switching unit 110.

The first voltage detector SV1 is connected in a parallel manner to the first short-circuit generator 209. The first voltage detector SV1 may detect an input terminal or output terminal voltage of the second semiconductor switching unit 120 and may supply the input terminal or output terminal voltage of the second semiconductor switching unit 120 to the controller 100.

The first and second insulated signal transmission elements 130 and 140 and the first and second current amount detectors of the circuit breaker control module according to the present disclosure may detect the current amount of the power transmission and distribution line and may supply the detection signal or voltage value corresponding to the current amount the controller 100. Thus, a circuit for detecting a voltage of the power transmission and distribution line is needed.

Thus, the first voltage detector SV1 is composed of a series of a plurality of resistors and supplies a distribution voltage value based on the series of the plurality of resistors to the controller 100.

The second voltage detector SV2 is connected in a parallel manner to the third short-circuit generator 211. The second voltage detector SV2 may detect an input terminal or output terminal voltage of the first semiconductor switching unit 110 and may supply the input terminal or output terminal voltage of the first semiconductor switching unit 110 to the controller 100. The second voltage detector SV2 is composed of a series of a plurality of resistors and supplies a distribution voltage value based on the series of the plurality of resistors to the controller 100.

According to the configuration of the first and second voltage detector SV1 and SV2, the controller 100 may compare the input terminal or output terminal voltage value of the second semiconductor switching unit 120 detected from the first voltage detector SV1 with the input terminal or output terminal voltage value of the first semiconductor switching unit 120 detected from the second voltage detector SV2. When a voltage difference therebetween is larger or smaller than a preset reference voltage value range, the controller 100 may cut off the current flow in the power distribution line by simultaneously transmitting the trip signal to the plurality of semiconductor switching units 110 and 120

In one example, as shown in FIG. 6, the circuit breaker control module according to the present disclosure may further include a first insulated signal transmitter 251, and a second insulated signal transmitter 250 as components to allow an isolation state between the controller 100 and the power transmission and distribution line to be maintained.

Specifically, the first insulated signal transmitter 251 is disposed between the first voltage detector SV1 and the controller 100 so that the first voltage detector SV1 and the controller 100 are insulated from each other. The first insulated signal transmitter 251 may transmit the input terminal or output terminal voltage value of the second semiconductor switching unit 120 detected from the first voltage detector SV1 to the controller 100.

The second insulated signal transmitter 250 is disposed between the second voltage detector SV2 and the controller 100 so that the second voltage detector SV2 and the controller 100 are isolated from each other. The second insulated signal transmitter 250 may transmit the input terminal or output terminal voltage value of the first semiconductor switching unit 110 detected from the second voltage detector SV2 to the controller 100. In this connection, each of the first and second insulated signal transmitters 251 and 250 may be composed of at least one isolator or a plurality of photocouplers so that each of the first and second voltage detectors SV1 and SV2 is insulated from the controller 100.

The controller 100 may receive the voltage values detected from the first and second voltage detectors SV1 and SV2 through the first and second insulated signal transmitters 251 and 250, respectively. Accordingly, the controller 100 may compare the voltage values detected from the first and second voltage detectors SV1 and SV2, respectively with each other. When a voltage difference therebetween is larger or smaller than a preset reference voltage value range, the controller 100 may control the plurality of semiconductor switching units 110 and 120 to cut off current flow in the power transmission and distribution line.

As described above, when the failure current of the power system or the power transmission and distribution line is cut off, the circuit breaker control module according to the present disclosure having various technical features as described above may use the electronic semiconductor switching structure to first break the failure line, thereby reduce risk of accident due to arcing.

Further, the circuit breaker control module according to the present disclosure having various technical features as described above may be capable of insulating the control circuit controlling the circuit breaker from the failure line through which the failure current flows, thereby increasing stability and reliability of the control circuit.

The present disclosure as described above may be subjected to various substitutions, modifications, and changes by a person having ordinary knowledge in the technical field to which the present disclosure belongs within a scope that does not depart from the technical idea of the present disclosure. Thus, the scope of the present disclosure is not limited to the above-described embodiments and the accompanying drawings.

What is claimed is:

1. A circuit breaker control module comprising:
a plurality of semiconductor switching units for cutting off current flow in a power transmission and distribution line or for switching a current flow direction in the power transmission and distribution line;
a controller configured to transmit a trip signal to each of the plurality of semiconductor switching units to control turn-on or turn-off operation of each of the plurality of semiconductor switching units; and
a plurality of insulated signal transmission elements disposed between each semiconductor switching unit of the plurality of semiconductor switching units and the controller to insulate the plurality of semiconductor switching units from the controller, wherein each insulated signal transmission element of the plurality of insulated signal transmission elements are configured to receive the trip signal from the controller and transmit the trip signal to a corresponding semiconductor switching unit of the plurality of semiconductor switching units, respectively,
wherein each insulated signal transmission element of the plurality of insulated signal transmission elements includes a plurality of photocouplers or at least one isolator,
wherein each insulated signal transmission element of the plurality of insulated signal transmission elements receive the trip signal from the controller, and transmit the trip signal to each of the plurality of semiconductor switching units by using the plurality of photocouplers or the at least one isolator.

2. The circuit breaker control module of claim 1, wherein the plurality of semiconductor switching units includes first and second semiconductor switching units,
wherein the first semiconductor switching unit includes:
a first switching element disposed at and directly connected in a series manner to the power transmission and distribution line and configured to be turned on or off based on the trip signal from the controller; and
a first diode element disposed at the power transmission and distribution line and connected in a parallel manner to the first switching element and configured to allow current to flow in the power transmission and distribution line when the first switching element is turned off,
wherein the second semiconductor switching unit includes:
a second switching element disposed at the power transmission and distribution line and connected in a series manner to the first switching element, and configured to be turned on or off based on the trip signal from the controller; and
a second diode element disposed at the power transmission and distribution line and connected in a parallel manner to the second switching element and having a current flow direction opposite to a current flow direction of the first diode element, wherein the second diode element is configured to allow current to flow in the power transmission and distribution line when the second switching element is turned off.

3. The circuit breaker control module of claim 2, wherein the controller is configured to:
transmit the trip signal to the first and second switching elements to turn off the first and second switching elements to cut off current flow in the power transmission and distribution line;
turn on the first switching element and transmit the trip signal only to the second switching element to turn off the second switching element to allow current in a reverse direction in the power transmission and distribution line; or
turn on the second switching element and transmit the trip signal only to the first switching element to turn off the first switching element to allow current in a forward direction in the power transmission and distribution line.

4. The circuit breaker control module of claim 1, wherein each of the plurality of insulated signal transmission elements includes a plurality of photocouplers or at least one isolator,
wherein the plurality of photocouplers or the at least one isolator transmit a detection signal corresponding to a current amount flowing in the power transmission and distribution line to each of the plurality of semiconductor switching units.

5. The circuit breaker control module of claim 1, wherein the plurality of semiconductor switching units includes first and second semiconductor switching units disposed at and directly connected in a series manner to the power transmission and distribution line,
wherein the circuit breaker control module further comprises:
at least one cut-off switch disposed at the power transmission and distribution line and connected in a series manner to the plurality of semiconductor switching units to cut off the power transmission and distribution line under control of the controller;
at least one inductance disposed at the power transmission and distribution line and connected in a series manner to the plurality of semiconductor switching units;
at least one overcurrent prevention fuse disposed at the power transmission and distribution line and connected in a series manner to the plurality of semiconductor switching units;
a first current amount detector disposed on an input terminal or an output terminal of the second semiconductor switching unit to detect a current amount flowing in the input terminal or the output terminal of the second semiconductor switching unit in real time and to transmit a first detection signal corresponding to the detected current amount to the controller.

6. The circuit breaker control module of claim 5, wherein the first current amount detector includes a Hall sensor spaced by a predetermined distance from the power transmission and distribution line, wherein the Hall sensor detects an electromagnetic field generated from the power transmission and distribution line, wherein the first current amount detector transmits current and voltage values corresponding to the detected electromagnetic field to the controller.

7. The circuit breaker control module of claim 5, wherein the circuit breaker control module further comprises a second current amount detector disposed on an input terminal or an output terminal of the first semiconductor switching unit to detect a current amount flowing in the input terminal or the output terminal of the first semiconductor switching unit in real time and to transmit a second detection signal corresponding to the detected current amount to the controller.

8. The circuit breaker control module of claim 7, wherein the controller is configured to:
compare the first detection signal from the first current amount detector with the second detection signal from the second current amount detector; and
when a voltage difference corresponding to a difference between the first and second detection signals is larger or smaller than a preset reference voltage value range, simultaneously transmit the trip signal to the first and second semiconductor switching units to cut off current flow in the power transmission and distribution line.

9. The circuit breaker control module of claim 5, wherein the circuit breaker control module further comprises:
a first short-circuit generator disposed between and connected to the input terminal or the output terminal of the second semiconductor switching unit and a first ground voltage source and connected in a parallel manner to the second semiconductor switching unit, wherein when a surge voltage occurs at the input terminal or the output terminal of the second semiconductor switching unit, the first short-circuit generator is configured to short the surge voltage to the first ground voltage source;
a second short-circuit generator connected in a parallel manner to the first and second semiconductor switching units, wherein when a surge voltage occurs across the plurality of semiconductor switching units, the second short-circuit generator is configured to short the surge voltage to a ground voltage; and
a third short-circuit generator disposed between and connected to an input terminal or an output terminal of the first semiconductor switching unit and a second ground voltage source and connected in a parallel manner to the first semiconductor switching unit, wherein when a surge voltage occurs at the input terminal or the output terminal of the first semiconductor switching unit, the third short-circuit generator is configured to short the surge voltage to the second ground voltage source.

10. The circuit breaker control module of claim 9, wherein the circuit breaker control module further comprises:
a first voltage detector connected in a parallel manner to the first short-circuit generator to detect an input terminal or output terminal voltage of the second semiconductor switching unit and supply the detected input terminal or output terminal voltage thereof to the controller; and
a second voltage detector connected in a parallel manner to the third short-circuit generator to detect an input terminal or output terminal voltage of the first semiconductor switching unit and supply the detected input terminal or output terminal voltage thereof to the controller.

11. The circuit breaker control module of claim 10, wherein the controller is configured to:
compare the input terminal or output terminal voltage of the second semiconductor switching unit detected from the first voltage detector with the input terminal or output terminal voltage of the first semiconductor switching unit detected from the second voltage detector; and
when a voltage difference voltage therebetween is larger or smaller than a preset reference voltage value range, simultaneously transmit the trip signal to the first and second semiconductor switching units to cut off current flow in the power transmission and distribution line.

12. The circuit breaker control module of claim 10, wherein the circuit breaker control module further comprises:
a first insulated signal transmitter disposed between and connected to the first voltage detector and the controller to insulate the first voltage detector and the controller from each other, wherein the first insulated signal transmitter is configured to transmit the input terminal or output terminal voltage of the second semiconductor switching unit detected from the first voltage detector to the controller; and a second insulated signal transmitter disposed between and connected to the second voltage detector and the controller to insulate the second voltage detector and the controller from each other, wherein the second insulated signal transmitter is configured to transmit the input terminal or output terminal voltage of the first semiconductor switching unit detected from the second voltage detector to the controller.

13. A circuit breaker control module comprising:
a plurality of semiconductor switching units for cutting off current flow in a power transmission and distribution line or for switching a current flow direction in the power transmission and distribution line;
a controller configured to transmit a trip signal to each of the plurality of semiconductor switching units to control turn-on or turn-off operation of each of the plurality of semiconductor switching units; and
a plurality of insulated signal transmission elements respectively disposed between the plurality of semiconductor switching units and the controller to insulate the plurality of semiconductor switching units from the controller, wherein the plurality of insulated signal transmission elements are configured to receive the trip signal from the controller and transmit the trip signal to the plurality of semiconductor switching units, respectively;
wherein the plurality of semiconductor switching units includes first and second semiconductor switching units disposed at and directly connected in a series manner to the power transmission and distribution line,
wherein the circuit breaker control module further comprises:
at least one cut-off switch disposed at the power transmission and distribution line and connected in a series manner to the plurality of semiconductor switching units to cut off the power transmission and distribution line under control of the controller;
at least one inductance disposed at the power transmission and distribution line and connected in a series manner to the plurality of semiconductor switching units;
at least one overcurrent prevention fuse disposed at the power transmission and distribution line and connected in a series manner to the plurality of semiconductor switching units;
a first current amount detector disposed on an input terminal or an output terminal of the second semiconductor switching unit to detect a current amount flowing in the input terminal or the output terminal of the second semiconductor switching unit in real time and to transmit a first detection signal corresponding to the detected current amount to the controller.

14. The circuit breaker control module of claim 13, wherein the plurality of semiconductor switching units includes first and second semiconductor switching units,
wherein the first semiconductor switching unit includes:
a first switching element disposed at and directly connected in a series manner to the power transmission and distribution line and configured to be turned on or off based on the trip signal from the controller; and
a first diode element disposed at the power transmission and distribution line and connected in a parallel manner to the first switching element and configured to allow current to flow in the power transmission and distribution line when the first switching element is turned off, wherein the second semiconductor switching unit includes:
a second switching element disposed at the power transmission and distribution line and connected in a series manner to the first switching element, and configured to be turned on or off based on the trip signal from the controller; and
a second diode element disposed at the power transmission and distribution line and connected in a parallel manner to the second switching element and having a current flow direction opposite to a current flow direction of the first diode element, wherein the second diode element is configured to allow current to flow in the power transmission and distribution line when the second switching element is turned off.

15. The circuit breaker control module of claim 14, wherein the controller is configured to:
transmit the trip signal to the first and second switching elements to turn off the first and second switching elements to cut off current flow in the power transmission and distribution line;
turn on the first switching element and transmit the trip signal only to the second switching element to turn off the second switching element to allow current in a reverse direction in the power transmission and distribution line; or
turn on the second switching element and transmit the trip signal only to the first switching element to turn off the first switching element to allow current in a forward direction in the power transmission and distribution line.

16. The circuit breaker control module of claim 13, wherein each of the plurality of insulated signal transmission elements includes a plurality of photocouplers or at least one isolator,
wherein the plurality of photocouplers or the at least one isolator receive the trip signal from the controller and transmit the trip signal to each of the plurality of semiconductor switching units.

17. The circuit breaker control module of claim 13, wherein each of the plurality of insulated signal transmission elements includes a plurality of photocouplers or at least one isolator,
wherein the plurality of photocouplers or the at least one isolator transmit a detection signal corresponding to a current amount flowing in the power transmission and distribution line to each of the plurality of semiconductor switching units.

18. The circuit breaker control module of claim 13, wherein the circuit breaker control module further comprises:
a first short-circuit generator disposed between and connected to the input terminal or the output terminal of the second semiconductor switching unit and a first ground voltage source and connected in a parallel manner to the second semiconductor switching unit;
a second short-circuit generator connected in a parallel manner to the first and second semiconductor switching units; and
a third short-circuit generator disposed between and connected to an input terminal or an output terminal of the first semiconductor switching unit and a second ground voltage source and connected in a parallel manner to the first semiconductor switching unit,
wherein:
when a surge voltage occurs at the input terminal or the output terminal of the second semiconductor switching unit, the first short-circuit generator is configured to short the surge voltage to the first ground voltage source;

when the surge voltage occurs at the input terminal or the output terminal of the first semiconductor switching unit, the third short-circuit generator is configured to short the surge voltage to the second ground voltage source; and when the surge voltage occurs across both the first and second semiconductor switching units, the second short-circuit generator is configured to short the surge voltage to a ground voltage via the first short-circuit generator and the third short-circuit generator.

\* \* \* \* \*